United States Patent
Faurie et al.

(10) Patent No.: US 9,318,314 B2
(45) Date of Patent: Apr. 19, 2016

(54) METHOD OF FORMING A FREESTANDING SEMICONDUCTOR WAFER

(71) Applicants: Jean-Pierre Faurie, Valbonne (FR); Bernard Beaumont, Le Tignet (FR)

(72) Inventors: Jean-Pierre Faurie, Valbonne (FR); Bernard Beaumont, Le Tignet (FR)

(73) Assignee: SAINT-GOBAIN CRISTAUX ET DECTECTEURS, Courbevoie (FR)

( * ) Notice: Subject to any disclaimer, the term of this patent is extended or adjusted under 35 U.S.C. 154(b) by 18 days.

(21) Appl. No.: 13/853,567

(22) Filed: Mar. 29, 2013

(65) Prior Publication Data

US 2013/0288455 A1    Oct. 31, 2013

Related U.S. Application Data

(60) Provisional application No. 61/617,818, filed on Mar. 30, 2012.

(51) Int. Cl.
*H01L 21/00*    (2006.01)
*H01L 21/02*    (2006.01)

(52) U.S. Cl.
CPC ...... *H01L 21/02016* (2013.01); *H01L 21/0242* (2013.01); *H01L 21/0245* (2013.01); *H01L 21/0254* (2013.01); *H01L 21/02458* (2013.01); *H01L 21/02502* (2013.01); *H01L 21/02609* (2013.01); *H01L 21/02617* (2013.01); *H01L 21/02664* (2013.01)

(58) Field of Classification Search
CPC ............... H01L 21/02016; H01L 21/0242; H01L 21/0245; H01L 21/02458
USPC ........................................................ 438/471
See application file for complete search history.

(56) References Cited

U.S. PATENT DOCUMENTS

| | | |
|---|---|---|
| 5,855,735 A | 1/1999 | Takada et al. |
| 6,667,184 B2 | 12/2003 | Motoki et al. |
| 7,164,187 B2 | 1/2007 | Nagasawa |
| 7,282,381 B2 | 10/2007 | Feltin et al. |
| 7,459,380 B2 | 12/2008 | Bour et al. |
| 7,777,217 B2 | 8/2010 | Preble et al. |
| 7,879,147 B2 | 2/2011 | Xu et al. |
| 7,972,711 B2 | 7/2011 | Xu et al. |
| 2007/0138505 A1 | 6/2007 | Preble et al. |
| 2007/0280872 A1 | 12/2007 | Okahisa et al. |

(Continued)

FOREIGN PATENT DOCUMENTS

| | | |
|---|---|---|
| JP | 2004059363 A | 2/2004 |
| WO | 2005031045 A2 | 4/2005 |
| WO | 2013144709 A2 | 10/2013 |

OTHER PUBLICATIONS

Machine translation of JP2004059363.*

(Continued)

*Primary Examiner* — Bradley K Smith
(74) *Attorney, Agent, or Firm* — Abel Law Group, LLP

(57) ABSTRACT

A method of forming a freestanding semiconductor wafer includes providing a semiconductor substrate including a semiconductor layer having a back surface and an upper surface opposite the back surface, wherein the semiconductor layer comprises at least one permanent defect between the upper surface and back surface, removing a portion of the back surface of the semiconductor layer and the permanent defect from the semiconductor layer, and forming a portion of the upper surface after removing a portion of the back surface and the permanent defect.

20 Claims, 3 Drawing Sheets

(56) References Cited

U.S. PATENT DOCUMENTS

| | | |
|---|---|---|
| 2008/0124510 A1 | 5/2008 | Xu et al. |
| 2009/0315149 A1* | 12/2009 | Okahisa et al. ............... 257/615 |
| 2010/0244197 A1 | 9/2010 | Arena et al. |
| 2010/0323506 A1* | 12/2010 | Cheng et al. .................. 438/507 |
| 2011/0042682 A1 | 2/2011 | Preble et al. |
| 2011/0221039 A1 | 9/2011 | Singh et al. |
| 2011/0233519 A1 | 9/2011 | Cheng et al. |
| 2012/0015143 A1* | 1/2012 | Chyan et al. .................. 428/141 |
| 2012/0040511 A1* | 2/2012 | Nakahata et al. ............. 438/471 |
| 2012/0187541 A1* | 7/2012 | Arena et al. .................. 257/615 |
| 2013/0001586 A1* | 1/2013 | Beaumont et al. .............. 257/76 |

OTHER PUBLICATIONS

International Search Report for PCT/IB2013/000565 dated Oct. 21, 2013 5 pgs.

* cited by examiner

METHOD OF FORMING A FREESTANDING SEMICONDUCTOR WAFER

CROSS-REFERENCE TO RELATED APPLICATION

This application claims priority under 35 U.S.C. §119(e) to U.S. Patent Application No. 61/617,818 entitled "A Method of Forming a Freestanding Semiconductor Wafer," by Faurie, filed Mar. 30, 2012, which is assigned to the current assignee hereof and incorporated herein by reference in its entirety.

BACKGROUND

1. Field of the Disclosure

The following is directed to methods of forming freestanding semiconductor wafers, and more particularly, freestanding semiconductor wafers comprising a Group 13-15 material.

2. Description of the Related Art

Semiconductive-based compounds, including Group 13-15 materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission in optoelectronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material and the existence of other crystalline morphological differences, including crystalline bow.

The existence of extended defects (threading dislocations, stacking faults, grain and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. Furthermore, other factors, such as the crystalline orientation can negatively impact the performance of devices formed on the GaN material.

SUMMARY

According to one aspect, a method of forming a freestanding semiconductor wafer includes forming a semiconductor layer having an upper surface, a back surface, and an opening extending through the layer from the upper surface to the back surface, the opening defining a portion of a permanent pit and including facets, and growing a portion of the semiconductor layer and closing the opening.

In yet another aspect, a method of forming a freestanding semiconductor wafer includes altering a permanent defect region including a portion of a permanent pit within a semiconductor layer, and forming a portion of the semiconductor layer after removing the permanent defect region and closing the pit.

According to another aspect, a method of forming a freestanding semiconductor wafer includes providing a semiconductor substrate comprising a semiconductor layer having a back surface, an upper surface, and a permanent pit extending from an upper surface of the semiconductor layer into the semiconductor layer to a bottom surface, removing the bottom surface of the permanent pit, and forming a portion of the upper surface after removing the bottom surface of the permanent pit.

In still another aspect, a method of forming a freestanding semiconductor wafer includes providing a semiconductor substrate comprising a semiconductor layer having a back surface and an upper surface opposite the back surface, wherein the semiconductor layer comprises at least one permanent defect between the upper surface and back surface, removing a portion of the back surface of the semiconductor layer and the permanent defect from the semiconductor layer, and forming a portion of the upper surface after removing a portion of the back surface and the permanent defect.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The following is generally directed to semiconductor materials, and particular, wafers made of a semiconductor material, which can be used in fabrication of electronic devices. More particularly, the freestanding wafers of the embodiments herein may be used in the formation of light emitting diodes (LEDs) or laser diodes (LDs). The freestanding wafers of the embodiment can include a Group 13-15 material including for example gallium nitride (GaN). It will be appreciated that reference to Group 13-15 materials, include compounds having at least one element from Group 13 of the Periodic Table of Elements and at least one element from Group 15 of the Periodic Table of Elements.

Figure 1:
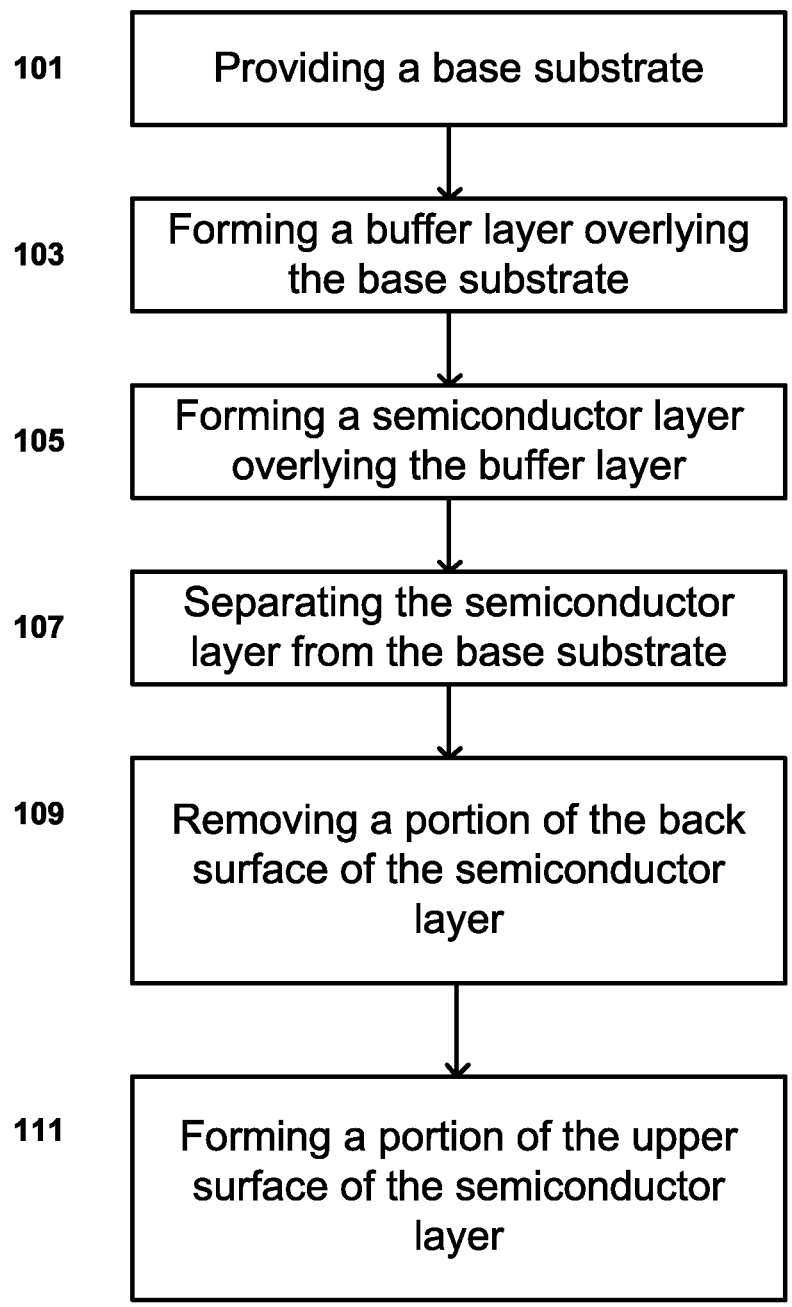
FIG. 1 includes a flowchart providing a method of forming a semiconductive substrate material for use in forming an electronic device in accordance with embodiment.

FIG. 1 includes a flow chart illustrating a method for forming a freestanding semiconductor wafer comprising a semiconductor material suitable for fabrication of electronic devices thereon in accordance with the embodiment. As illustrated, the process can be initiated at step 101 by providing a base substrate. The base substrate can be a structure suitable for supporting a plurality of layers formed thereon, such as a heteroepitaxial support structure.

In accordance with one embodiment, the base substrate can be an inorganic material. Some suitable inorganic materials can include oxides, carbides, nitrides, borides, oxycarbides, oxyborides, oxynitrides, and a combination thereof. In certain instances the base substrate can include alumina, and more particularly, may include single crystal alumina (i.e., sapphire). One embodiment utilizes a base substrate consisting essentially of sapphire.

Figure 2A:
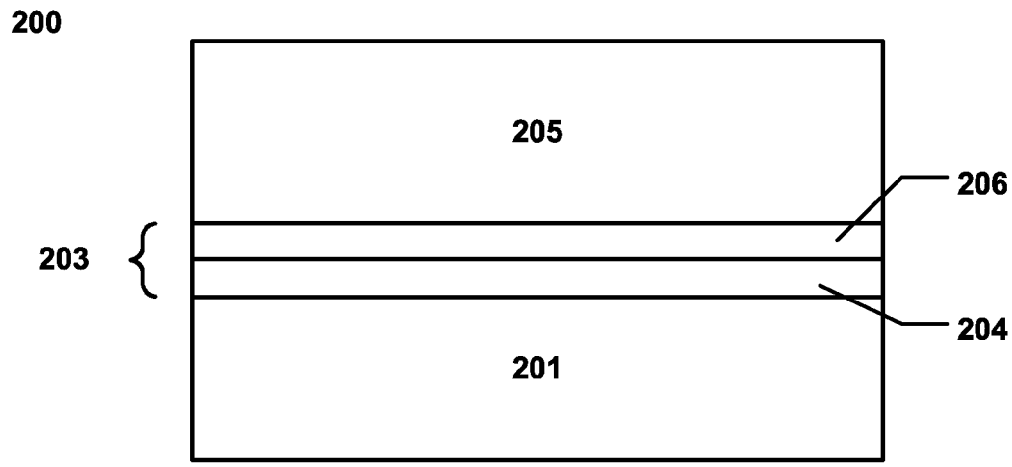
FIG. 2A includes a cross-sectional illustration of a semiconductor substrate during processing in accordance with an embodiment.

The process can continue at step 103 by forming a buffer layer overlying the base substrate. Turning briefly to FIG. 2A, a semiconductor substrate 200 is illustrated in accordance with an embodiment. Notably, the semiconductor substrate 200 can include a base substrate 201 and a buffer layer 203 overlying the base substrate 201. In particular, the buffer layer 203 can overlie an upper major surface of the base substrate 201, and more particularly, the buffer layer 203 can be in direct contact with the upper major surface of the base substrate 201.

Forming the buffer layer 203 can include a deposition process. For example, the substrate can be loaded into a reaction chamber, and after providing a suitable environment within the reaction chamber, a buffer layer can be deposited on the base substrate 201. According to one embodiment, a suitable deposition technique can include chemical vapor deposition. In one particular instance, the deposition process can include metal-organic chemical vapor deposition (MOCVD).

The buffer layer 203 may be formed from a plurality of films. For example, as illustrated in FIG. 2A, the buffer layer 203 can include a film 204 and a film 206. In accordance with an embodiment, at least one of the films can include a crystalline material. In more particular instances, the film 204, which can be in direct contact with the surface of the base substrate 201, can include silicon, and may consist essentially of silicon. The film 204 may facilitate separation between the base substrate 201 and semiconductor layers overlying the film 204 as described herein.

As illustrated in FIG. 2A, the film 206 can overly, and more particularly, can be in direct contact with the film 204. The film 206 can have suitable crystallographic features for epitaxial formation of subsequent layers formed thereon. Notably, in one embodiment, the film 204 can include a semiconductor material. Suitable semiconductor materials can include a Group 13-15 compound material. In one particular instance, the film 206 can include a nitride material. In another example, the film 206 can include gallium, aluminum, indium, and a combination thereof. Still, in one particular embodiment, the film 206 can comprise aluminum nitride, and more particularly, the film 206 can consist essentially of aluminum nitride.

In an exemplary structure, the buffer layer 203 can be formed such that the film 204 includes silicon and is directly contacting a major surface of the base substrate 201. Furthermore, the film 206 can directly contact a surface of the film 204 and include a Group 13-15 material.

After forming a buffer layer at step 103, the process can continue at step 105 by forming a semiconductor layer 205 overlying the buffer layer 203. Referring briefly to FIG. 2A, the semiconductor substrate 200 can include a semiconductor layer 205 overlying the buffer layer 203. In particular, the semiconductor layer 205 can be formed such it is overlying a surface of the buffer layer 203, and more particularly, the semiconductor layer 205 can be in direct contact with the film 206 of the buffer layer 203.

It will also be appreciated that the formation of semiconductor substrates according to embodiments herein may be achieved without necessarily creating a mask or modifying the surface of the substrate via grooving or roughening, or utilization of etching techniques.

According to an embodiment, upon suitably forming a buffer layer 203, the base substrate 201 and buffer layer 203 may be placed within a reaction chamber for further processing, including for example, an epitaxial growth process. The semiconductor layer 205 can be formed through an epitaxial growth process, such as hydride vapor phase epitaxy (HYPE). In one particular instance, the semiconductor layer 205 can be made of a Group 13-15 material. Some suitable Group 13-15 materials can include nitride materials. Furthermore, the semiconductor layer 205 may include gallium. In one embodiment, the semiconductor layer 205 may include gallium nitride (GaN), and more particularly, may consist essentially of gallium nitride.

Certain methods of forming the semiconductor layer 205 can be undertaken. For example, the epitaxial growth of the semiconductor layer 205 can be conducted in various growth modes. According to one embodiment, a first region of the semiconductor layer 205 can be grown in a first mode, and a second region of the semiconductor layer 205 can be grown in a second mode different than the first mode. For example, in more particular instances, the semiconductor layer 205 can be initially formed as an epitaxial layer grown in a 3-dimensional (3D) growth mode. In a 3D growth mode the growth surface develops a rough and non-planar 3D morphology with pits, facets as well as terraces. The growth of the semiconductor layer 205 progresses along the c-axis and through simultaneous growth along multiple crystallographic directions. Under 3D growth conditions, the lower region of the semiconductor layer 205 can be initially formed through spontaneous formation of island features on the buffer layer 203. The spontaneously formed island features can be randomly positioned on the buffer layer 203, defining various mesas having multiple facets and valleys between the mesas. The randomly positioned island features can be discrete objects, spaced apart from each other on the upper surface of the buffer layer 103.

Alternatively, or additionally, the semiconductor layer 205 can be formed using a 2-dimensional (2D) epitaxial growth mode. In a 2D growth mode, the growing surface can be smooth and remain essentially planar during the growth process. The 2D growth may be considered a layer-by-layer growth process, which can be characterized by preferential growth of the material in one crystallographic plane and limited growth of the crystalline material along other crystallographic directions. For example, in one embodiment, formation of a semiconductor layer 205 comprising GaN in a 2D growth mode can include preferential growth of the GaN in the c-plane (0001).

As indicated above, the semiconductor layer 205 can be formed using a combination of 3D and 2D growth modes. For example, a first region of the semiconductor layer 205 may be initially formed in a 3D growth mode, wherein island features are spontaneously formed and randomly arranged on the buffer layer 203 as a non-continuous layer of material. However, if the 3D mode growth is pursued the layer becomes continuous, exhibiting a faceted aspect and a substantially non-uniform thickness. Following the 3D growth mode, growth parameters can be altered to change to a 2D growth mode, wherein lateral growth is favored and thickness uniformity across the entire semiconductor layer 205 can be improved. In certain processes, the upper region of the semiconductor layer 205 can be formed through a 2D growth mode. Combining 3D and 2D growth modes can facilitate reduction of the dislocation density of the semiconductor layer 205.

It will be appreciated that formation of the semiconductor layer 205 can include multiple changes in growth modes. For example, in one embodiment, the base layer can be formed by an initial 3D growth mode, followed by a 2D growth mode, and further growth in a 3D growth mode.

Switching between growth modes may be completed by modification of certain growth parameters including growth temperature, growth rate, pressure of vapor phase reactant and non-reactant materials, ratio of reactant and non-reactant materials in the reaction atmosphere, growth chamber pressure, and a combination thereof. Reactant materials can include nitrogen-containing materials, such as ammonia. Other reactant materials can include halide phase components, including for example, metal halide components such as gallium chloride. Non-reactant materials can include certain types of gases, including for example, noble gases, inert gases, and the like. In particular instances the non-reactant material can include gases such as nitrogen and or hydrogen.

For certain processes, the growth temperature may be changed to facilitate a change between 3D and 2D growth modes. In one embodiment, change of the growth temperature can include an increase in the growth temperature to change from 3D to a 2D growth mode. For example, in changing from a 3D to a 2D growth mode, the temperature may be changed by at least about 5° C., such as at least about 10° C., at least about 15° C., at least about 20° C., at least about 30° C., at least about 35° C., or even at least about 40° C. In still other embodiments, in changing from a 3D to a 2D growth mode, the growth temperature can be changed by not greater than about 100° C., such as not greater than about 90° C., not greater than about 80° C., not greater than about 70° C., or even not greater than about 60° C. It will be appreciated that the change in growth temperature can be within a range between any of the minimum and maximum values noted above.

In accordance with an embodiment, the process of forming the semiconductor layer 205 can be conducted at a growth rate of at least 50 microns per hour (microns/hr). In other embodiments, the rate of forming the semiconductor layer 205 can be greater, such as at least about 75 micron per hours, at least about 100 microns per hour, at least about 150 microns per hour, at least about 200 microns per hour, or even at least about 250 microns per hour. In another embodiment, the process of forming the semiconductor layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, the growth rate can be decreased in changing from 3D to a 2D growth mode. In particular, changing from 3D to 2D growth can include altering the growth rate by at least about 5 microns per hour (i.e., microns/hr). In still other embodiments, in changing from 3D to a 2D growth mode, the growth rate can be changed by not greater than about 200 microns per hour. It will be appreciated that the change in growth rate can be within a range between any of the minimum and maximum values noted above. It will be appreciated that the change in growth rate can be a decrease in the growth rate when changing from 3D to a 2D growth mode.

According to other embodiments, the process of changing from 3D to 2D growth modes may be completed by a change in growth rate by at least a factor of 2. For example, the growth rate can be changed (i.e., decreased) by a factor of at least 2 in changing from a 3D growth mode to a 2D growth mode. In other embodiments, the growth rate can be changed by a factor of at least about 3, at least about 4, or even at least about 5. In particular instances, the change in the growth rate can be not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes.

After suitably forming the semiconductor layer 205, the average thickness of the semiconductor layer 205 can be sufficient to support itself and provide a suitable substrate surface for the formation of electronic devices thereon after certain post-formation shaping processes. For example, the average thickness of the semiconductor layer 205 can be at least about 1 mm. In other instances, the average thickness of the semiconductor layer 205 can be at least about 2 mm, such as least 3 mm, at least 4 mm, at least 5 mm, or even at least 6 mm. Still, it will be appreciated that the semiconductor layer 205 can be formed such as that it has an average thickness of not greater than about 15 mm. The semiconductor layer 205 can have an average thickness within a range of any of the minimum of maximum values noted above.

During the process of formation of the semiconductive layers, including for example, the semiconductor layer 205, the base substrate 201 may be separated from the semiconductor layer 205. The separation can be facilitated by the dissociation of a portion of the buffer layer 203, and particularly, a film within the buffer layer 203. In accordance with an embodiment, the buffer layer 203 can include a film, such as silicon, wherein at elevated temperatures utilized during the growth process, the film is thermally dissociated. Thermal dissociation facilitates separation between the base substrate 201 and the plurality of semiconductive layers. Accordingly, upon completion of the growth process, the semiconductor layer 205 can be completely removed from the base substrate 201.

Figure 2B:
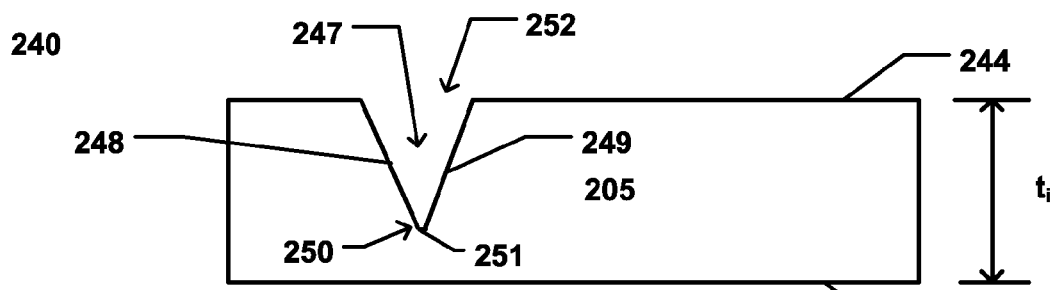
FIG. 2B includes a cross-sectional illustration of a portion of a semiconductor substrate during processing in accordance with an embodiment.

After separating the base substrate 201 from the semiconductor layer 205, an unfinished freestanding wafer can be obtained of the material of the semiconductor layer 205. FIG. 2B includes an illustration of an unfinished free standing wafer according to an embodiment. As illustrated, the freestanding wafer 240 can include the semiconductor layer 205 having an upper surface 244 representing a Ga-face and a back surface 246 representing a N-face.

As further illustrated in FIG. 2B, the unfinished freestanding wafer 240 can include a defect 247 within the semiconductor layer 205. As illustrated, the defect 247 can be in the form of a pit extending into the volume of the semiconductor layer 205 as defined by the thickness (t). In accordance with the embodiment, the defect 247 can be in the form of a permanent pit. A permanent pit can be a defect that cannot be removed through conventional growth techniques, including for example alternation of 3D/2D growth modes. The permanent pit may be a macroscopic pit, which can display a hexagonal or a dodecagonal shape. The permanent pit may have an inverted pyramidal shape. The permanent pit may include side surfaces defined by a facet. Such facets may be semi-polar facets, that can be defined by particular crystalline planes of the semiconductor material, including for example, a {11-22} plane, a {1-101} plane, and a combination thereof.

As illustrated in FIG. 2B, the defect 247 section can include a first side 248 and a second side 249. The first side 248 and the second side 249 may define equivalent facets from the same crystal family planes. In particular instances, the {11-22} plane and the {1-101} plane can be primary facets forming the side surfaces of the permanent pit, other semi-polar crystalline planes of the semiconductor material can be facets defining a surface proximate to a bottom surface of the pit. For example, the bottom surface of the permanent pit, or a surface near the bottom surface of the permanent pit may include the {11-2n} plane or the {1-10n} plane, wherein n≥2.

As further illustrated, the defect 247 can include a permanent defect region 250. In certain instances, the permanent defect region 250 can include a bottom surface of the defect 247. In particular instances, the permanent defect region 250 can be defined by the bottom surface 251 of the defect 247. In accordance with another embodiment, the bottom surface 251 may define a particular type of permanent defect, including for example, an inclusion, a polycrystalline grain, a single crystalline grain, with or without a common c-axis with the surrounding semiconductor material of layer 205, an inversion domain, a boundary (e.g., an anti-phase boundary, a twin boundary, a grain boundary), and a combination thereof.

A boundary can define a region of the semiconductor layer that represents a shift in the regular arrangement of crystalline phases. For example, a polarity inversion of the crystalline structure, including for example, a change in the order of polar planes, such as a Ga-polar face and a N-polar face of the crystal structure, results in an anti-phase boundary. A shift between crystalline planes having a twin relation creates a boundary called a twin boundary. Moreover, a shift in crystal orientation between a single crystal in the defect region and the surrounding crystalline structure of the semiconductor material of the semiconductor layer 205 can define a permanent defect in the form of a grain boundary. The defect 247 can define permanent and irreversible region within the crystalline structure of the semiconductor layer 205 that may be propagated through the structure through further growth and may not be readily removed through continuous growth techniques.

According to one embodiment, the permanent defect region 250 can include at least one anti-phase boundary. The anti-phase boundary of the permanent defect region 250 can be located between the upper surface 244 and the back surface 246 of the semiconductor layer 205.

As further illustrated, the defect 247 can include an upper opening 252 defined by the intersection of the first side 248 and the second side 249 with the upper surface 244 of the semiconductor layer 205. As further illustrated, the defect 247 can be in the shape of a pit such that the bottom surface 251 defines a smaller area than the area of the upper opening 252.

Referring again to FIG. 1, after separating the semiconductor layer from the base substrate, the process can continue at step 109 by removing a portion of the back surface 246 of the semiconductor layer. One suitable process for removing a back portion of the back surface 246 of the semiconductor layer 205 can include mechanically removing a portion of the back surface 246. For example, the process can include grinding or abrading the back surface 246 of the semiconductor layer 205. In accordance with a particular embodiment, the process of removing a portion of the back surface 246 of the semiconductor layer 205 can further include removal of the permanent defect region 250 within the semiconductor layer 205. It will be appreciated that the removal of the permanent defect region 250 can include removal of a portion of the defect 247, including for example an inclusion, a polycrystalline grain, a single crystalline grain, an inversion domain, a boundary, and a combination thereof, which can be associated with the permanent defect region 250.

In certain instances, the process of removing a portion of the back surface 246 of the semiconductor layer 205 and the permanent defect region 250, which may be defined by an anti-phase boundary, can utilize the same process. That is, the grinding process may be used to facilitate removal of a portion of the back surface 246 of a semiconductor layer 205 and the permanent defect region 250. Moreover, the process of removing a portion of the back surface 246 of the semiconductor layer 205 and the permanent defect region 250 can be conducted simultaneously.

According to one particular embodiment, the process of mechanically removing a portion of the back surface 246 can include a series of abrasive processes. For example, the removing process can be initiated by a first grinding process to remove a significant portion of material from the back surface 246 of the semiconductor layer 205. The first grinding process may utilize a fixed abrasive, and particularly, a self-dressing vitrified bonded abrasive article. The first grinding process may be followed by a second removal process. The second removal process can include a fine grinding process, lapping process, polishing process, and a combination thereof. In a certain fine grinding process, a second fixed abrasive article (e.g., a self-dressing vitrified bonded abrasive) may be used that has a finer abrasive grit size as compared to a fixed abrasive used in the first grinding process. Additionally or alternatively, the second removal process can include a lapping process, which may utilize a pad and a free abrasive slurry. The free abrasive slurry may include chemical components that can facilitate chemical removal of the material of the back surface 246. Additionally or alternatively, the second removal process may include a polishing process that can include use of a free abrasive slurry having a particularly fine abrasive particulate size.

Figure 2C:
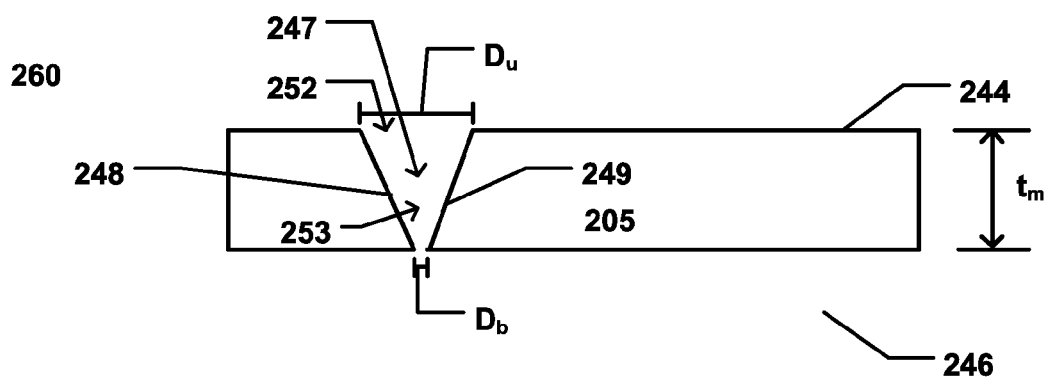
FIG. 2C includes a cross-sectional illustration of a portion of a semiconductor substrate during processing in accordance with an embodiment.

FIG. 2C includes an illustration of an unfinished freestanding wafer after conducting a process of removing a portion of the back surface 246 of the semiconductor layer 205 and the permanent defect region 250. As illustrated, the process of removing can include a reduction in the average thickness of the semiconductor layer 205. In accordance with an embodiment, the process of removing can include reducing the average thickness of the semiconductor layer 205 by at least about 5% of the original thickness ($t_i$) of the semiconductor layer 205 prior to the process of removing. The change (e.g., reduction) in average thickness ($\Delta t$) can be measured by the equation $((t_i-t_r)/t_i)$, wherein $t_i$ is the initial thickness and $t_r$ is the thickness of the semiconductor layer 205 after conducting the removing process. In other embodiments, the process of removing can remove a greater amount of material thus decreasing the average thickness of the semiconductor layer 205 by a greater percentage. For example, the process can include reducing the average thickness of the semiconductor layer by at least about 10%, by at least about 12%, by at least about 16%, by at least about 18%, by at least about 22%, by at least about 26%, by at least about 32%, by at least about 36%, by at least about 42%, or even at least about 48%. Still, in one embodiment, the process can reduce the average thickness of the semiconductor layer 205 by not greater than about 80%. It will be appreciated that the change in the average thickness of the semiconductor layer 205 can be within a range between any of the minimum and maximum percentages noted above.

As further illustrated in FIG. 2C, after conducting the process of removing, an opening 253 is defined in the semiconductor layer 205. The opening 253 can represent a portion of the defect 247, which could include the permanent pit, after removal of the bottom surface 251 through the removing process. In certain instances, the defect 247 may extend through the entire thickness of the semiconductor layer 205 from the upper surface 244 to the back surface 246. As illustrated, the opening 253 can extend through the entire thickness of the semiconductor layer 205. Furthermore, as illustrated, the opening 253 can be defined by a tapered shape, wherein the diameter of the opening 253 at the back surface 246 can have a diameter ($D_b$) that is smaller than the diameter of the opening 253 at the upper surface 244 ($D_u$). In accordance with the embodiment, the diameter of the opening 253 at the upper surface is significantly greater than the diameter of the opening at the back surface. Moreover, the opening 253 can be defined by at least one facet, which may define the first side surface 248. In other embodiments, the opening 253 can be defined by a plurality of facets that may extend around the perimeter and define the side surfaces 248 and 249. For example, the opening 253 can have a hexagonal or dodecagonal inverted truncated pyramidal shape comprising semi-polar crystalline planes, such as the $\{11\text{-}22\}$ and $\{1\text{-}101\}$ crystalline planes as facets.

In an alternative embodiment, the process of removing can be conducted by a chemical process. For example, the process of removing a portion of the back surface 246 of the semiconductor layer 205 can include chemically removing a portion of the back surface 246. Certain suitable examples of chemically removing can include processes such at etching. In accordance with an embodiment, an etching process may be completed using an etchant, which is a chemical utilized to selectively remove material the semiconductor layer 205. Certain suitable etchants can include oxidizing materials, halogen-containing materials, and a combination thereof.

As will be appreciated, the process of chemically removing a portion of the back surface 246 can also include a process of removing the permanent defect region 250 from the semiconductor layer 205 as described in embodiments herein. Moreover, the process of chemically removing can include a change in average thickness as described in the embodiments herein.

In one alternative embodiment, the process of removing may be optionally replaced with a masking process. After conducting growth of the semiconductor layer 205 to a sufficient thickness, a masking process may be conducted, wherein a layer of material (i.e. a mask) is deposited to cover the entire upper surface 244 of the semiconductor layer 205. Masking can include deposition of a material over the upper surface 244 and the defect 247 including the opening 252, the first side 248, the second side 249, and the bottom surface 251.

The mask can include an oxide, a carbide, a nitride, an oxynitride, an oxycarbide, and a combination thereof. In particular embodiment, the mask comprises silicon nitride. Alternatively, the mask may include an organic material, including for example, a photosensitive material.

For at least one embodiment, the mask can have an average thickness significantly less than the average thickness of the semiconductor layer 205. For example, the mask can have an average thickness of not greater than about 10% of the average thickness of the semiconductor layer 205, such as not greater than about 8%, not greater than about 5%, or even not greater than about 2%. In one non-limiting embodiment, the mask can have an average thickness of at least 0.01% of the average thickness of the semiconductor layer 205. In one particular embodiment, the mask can have an average thickness of at least about 1 nm. The masking process may be sufficient to overlie the permanent defect 250 and limit propagation of the crystalline defect to a layer that is grown on the top of the mask in the opening 252 defined by the permanent defect 250.

After forming the mask over at least a portion of the upper surface 244 of the semiconductor layer 205, the process can continue by selectively removing portions of the mask overlying portions of the upper surface 244. In particular, the mask may be selectively removed from portions of the upper surface 244 that are not characterized by a defect 247. For example, the mask may be removed from portions of the upper surface 244 parallel to the back surface 246, however, at least a portion of the mask may be retained and overlying a portion of the defect 247, including for example, overlying the first side 248, the second side 249, bottom surface 251, and a combination thereof. In one particular embodiment, after selectively removing, at least a portion of the mask can be retained and in direct contact with the bottom surface 251 of the defect 247 and removed from all other surfaces of the upper surface 244. Suitable techniques for removing a portion of a mask can include photolithography techniques, selective etching techniques, and a combination thereof.

In yet another alternative process, the process of forming the mask can be completed in a selective manner, such that the mask is not a conformal layer, but defines covered portions and uncovered portions of the semiconductor layer, wherein the uncovered portions are defined by openings in the mask. The covered portions can be regions of the semiconductor layer 205 underlying mask portions. The openings can be defined by regions of the semiconductor layer 205, wherein the mask portions are not present and a portion of the semiconductor layer 205 is exposed. Selective forming of the mask can include selective deposition, photolithography, selective etching, and a combination thereof.

According to one embodiment, the process of forming the selective mask can include selective deposition of the mask to overlie, and in particular instances, be in direct contact with, a portion of the defect 247 in the semiconductor layer 205, including for example, the first side 248, the second side 249, bottom surface 251, and a combination thereof. Moreover, the selective deposition process can include depositing essentially no mask material on portions of the semiconductor layer 205 upper surface 244 that are not associated with a defect 247. In one particular embodiment, the mask portions formed through the selective deposition process can be notably thin, such as on the order of less than about 500 nm, less than about 200 nm, or even less than about 100 nm. Such mask portions may be considered nano-mask portions. Accordingly, the nano-mask portions may be retained and are not necessarily removed prior to continued processing, which can include a process of re-growing the semiconductor layer 205 over the mask portions.

While the masking process has been described as an alternative process, it will be appreciated that such a process may be used in combination with any other processes described herein, including for example, a mechanical removal process. Moreover, while reference has been made specifically to masking and/or mechanical removal techniques, it will be considered that such techniques may be more broadly referred to as methods of altering a permanent defect in the semiconductor layer 205.

Referring again to FIG. 1, after conducting an altering process, such as removing a portion of the back surface 246 of the semiconductor layer 205 and/or after a masking process, the method can continue at step 111 by forming a portion of the upper surface 244 of the semiconductor layer 205. In accordance with an embodiment, the process of forming a portion of the upper surface can be conducted after removing a portion of the back surface and at least one permanent defect region within the semiconductor layer 205. In certain instances, the process of forming can include a growth process. For example, certain surfaces of the semiconductor layer 205, including surfaces defining the upper surface 244, may undergo a regrowing process. In accordance with one particular embodiment, the process of forming a portion of the upper surface can include an epitaxial process, and more particularly, may include a HVPE growth of GaN on the upper surface 244.

Moreover, in addition to a process of forming a portion of the upper surface 244 of the semiconductor layer 205, the process can further include regrowing at surfaces of the defect 247. In particular, the process of forming may include regrowing and coalescing semiconductor material in the defect 247 to effectively close and remove the defect. It will be appreciated that such forming processes may include the use of different growth modes, including epitaxial 3-dimensional growth, epitaxial 2-dimensional growth, and a combination thereof. As will also be appreciated, the growing process can include an increase in the thickness of the semiconductor layer 205 after the removal process.

Figure 2D:
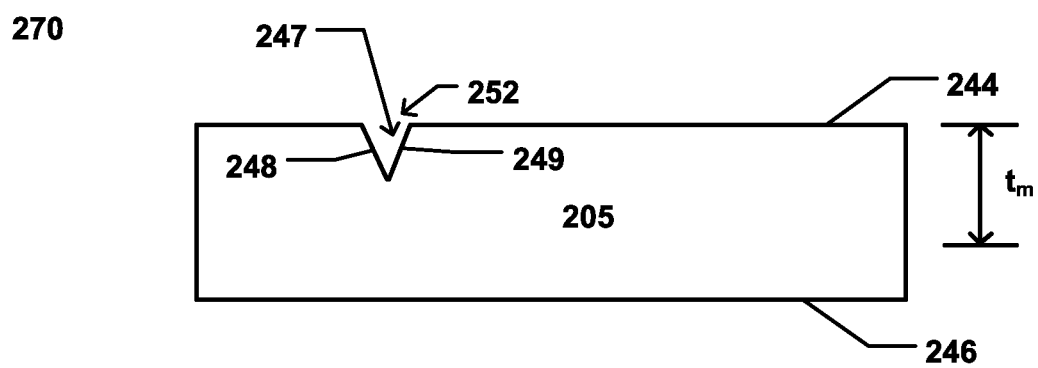
FIG. 2D includes a cross-sectional illustration of a portion of a semiconductor substrate during processing in accordance with an embodiment.

FIG. 2D includes a cross-sectional illustration of a portion of an unfinished freestanding wafer after initiating the forming process. As illustrated, the defect 247, which previously defined an opening 253 extending through the entire thickness of the semiconductor layer 205 can be reduced in size via the regrowing process described in an embodiment herein. The forming process can include growth of the semiconductor material of the semiconductor layer 205 in a manner to facilitate closing of the opening 253 and reduction of the defect 247 in a manner such that it may entirely disappear. For example, in one embodiment, closing of the opening 253 may be completed by lateral overgrowth of the semiconductor layer 205 in the opening 253.

Figure 2E:
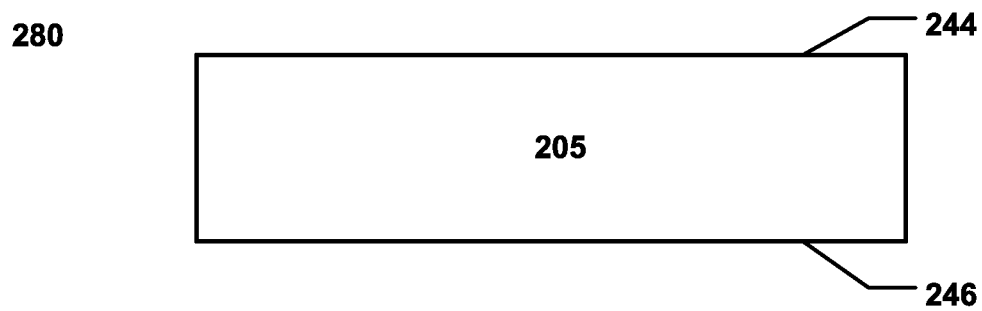
FIG. 2E includes a cross-sectional illustration of a finished freestanding wafer in accordance with an embodiment.

FIG. 2E includes a cross-sectional illustration of a finished freestanding wafer after completing the forming process according to an embodiment. Notably, the freestanding wafer 280 can be formed of the semiconductor layer 205. After completing the processes described herein, the upper surface 244 of the semiconductor layer 205 can have a significantly reduced number of defects as compared to a wafer formed through conventional processes. In certain instances, the finished freestanding wafer can be essentially free of any permanent defects.

After suitably forming the body of the freestanding wafer, the body can be sufficiently thick to support itself and provide a suitable substrate surface for the formation of electronic devices thereon. For example, the average thickness of the body of the freestanding wafer can be at least about 1 mm. In other instances, the average thickness of the body can be at least about 2 mm, such as least 3 mm, at least 4 mm, at least 5 mm, or even at least 6 mm. Still, it will be appreciated that the body can be formed such as that it has an average thickness of not greater than about 15 mm. The body can have an average thickness within a range of any of the minimum of maximum values noted above.

The body of the freestanding wafer can be formed to have a particular dislocation density. The dislocation density of the freestanding wafer can be measured at the upper surface of the body, which can be defined by the upper surface 244 of the semiconductor layer 205. A suitable method of measuring the dislocation density includes use of cathodoluminescence microscopy operated at room temperature and polychromatic light detection without monochromator under 10 keV e-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 μm$^2$. For a dislocation density measurement of approximately $10^6$ cm$^2$, the magnification is typically 500-1000× and the area is typically 0.1 mm$^2$.

According to one embodiment, the body can have a dislocation density of not greater than about $1\times10^8$ dislocation/cm$^2$, as measured at an upper surface of the semiconductor layer 205. In other embodiments, the dislocation density of the body of the freestanding wafer can be less, such that it is not greater than about $1\times10^7$ dislocation/cm$^2$, not greater than about $8\times10^6$ dislocation/cm$^2$, or even not greater than about $1\times10^6$ dislocation/cm$^2$. Still, the body may have a dislocation density that is at least about $1\times10^5$ dislocation/cm$^2$, such as at least $2\times10^5$ dislocation/cm$^2$, at least $3\times10^5$ dislocation/cm$^2$, or even at least $5\times10^5$ dislocation/cm$^2$. It will be appreciated that the body can have a dislocation density within a range within any of the minimum and maximum values noted above.

The embodiments herein represent a departure from the state-of-the-art. While certain bulk GaN substrates have been formed, such processes typically involve formation of a freestanding GaN wafer, which may include propagated defects at the surface of the freestanding wafer. The present application discloses a combination of process features, including but not limited to, growth parameters and processes, removing processes and parameters, and regrowing processes and parameters that facilitate the formation of freestanding wafers. The wafers of the embodiments herein can have a particular combination of features including, but not limited to, offcut angle, offcut angle variation, bow, crystalline bow, TTV, thickness, diameter, surface roughness, crystalline orientation, defect density, reduced permanent defect propagation, and the like. Moreover, the processes of embodiments herein have proven useful in forming production lots of wafers.

In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A method of forming a freestanding semiconductor wafer comprising:
   providing a semiconductor substrate comprising a semiconductor layer having a back surface and an upper surface opposite the back surface, wherein providing a semiconductor substrate comprises forming a buffer layer overlying a base substrate, the buffer layer including Ga, Al, In, or a combination thereof, and the semiconductor layer comprising at least one permanent defect between the upper surface and back surface;
   removing a portion of the back surface of the semiconductor layer and the permanent defect from the semiconductor layer; and
   forming a portion of the upper surface after removing a portion of the back surface and the permanent defect.

2. The method of claim 1, wherein the semiconductor layer comprises a Group 13-15 material.

3. The method of claim 1, wherein the semiconductor layer comprises an average thickness of at least about 1 mm.

4. The method of claim 1, wherein the semiconductor layer comprises a dislocation density of not greater about $1 \times 10^6$ dislocations/cm$^2$.

5. The method of claim 1, wherein the at least one permanent defect between the upper surface and back surface defines a bottom surface of a permanent pit.

6. The method of claim 5, wherein the permanent pit comprises an upper opening intersecting the upper surface of the semiconductor layer.

7. The method of claim 1, wherein the permanent defect defines a region of the semiconductor layer having a shift in the regular arrangement of crystalline planes.

8. The method of claim 1, wherein removing a portion of the back surface of the semiconductor layer and the permanent defect from the semiconductor layer comprises removing the back surface and the permanent defect using the same process.

9. The method of claim 1, wherein forming a portion of the upper surface after removing comprises re-growing a portion of the semiconductor layer, wherein re-growing comprises coalescing semiconductor material in the opening defined by a portion of a permanent pit in the semiconductor layer.

10. A method of forming a freestanding semiconductor wafer comprising:
    forming a buffer layer overlying a base substrate, wherein the buffer layer including Ga, Al, In, or a combination thereof;
    forming a semiconductor layer overlying the buffer layer, wherein the semiconductor layer has a back surface, an upper surface, and a permanent pit extending from an upper surface of the semiconductor layer into the semiconductor layer to a bottom surface;
    removing the bottom surface of the permanent pit; and
    forming a portion of the upper surface after removing the bottom surface of the permanent pit.

11. The method of claim 10, wherein the semiconductor layer comprises a Group 13-15 material.

12. The method of claim 10, wherein the bottom surface defines at least one inclusion, one polycrystalline grain, one single crystalline grain, one inversion domain, or any combination thereof.

13. The method of claim 10, wherein the permanent pit comprises an upper opening intersecting the upper surface of the semiconductor layer.

14. The method of claim 10, wherein forming a portion of the upper surface after removing comprises coalescing semiconductor material in the opening defined by a portion of the permanent pit in the semiconductor layer.

15. A method of forming a freestanding semiconductor wafer comprising:
    forming a buffer layer overlying a base substrate, wherein the buffer layer comprises:
       a first film including silicon overlying a surface of the base substrate; and
       a second film including Ga, Al, In, or a combination thereof overlying the first film;
    forming a semiconductor layer overlying the buffer layer, wherein the semiconductor layer comprises a permanent defect region including a permanent pit;
    altering the permanent defect region including a portion of the permanent pit within the semiconductor layer; and
    forming a portion of the semiconductor layer after altering the permanent defect region and closing the pit.

16. The method of claim 15, wherein forming a portion of the semiconductor layer comprises re-growing a portion of the semiconductor layer, wherein re-growing comprises conducting epitaxial growth by a three-dimensional (3D) growth mode.

17. The method of claim 15, wherein the permanent defect region is defined by a bottom surface of the permanent pit.

18. The method of claim 15, wherein the semiconductor layer comprises a back surface, an upper surface, and the permanent pit extending from an upper surface of the semiconductor layer into the semiconductor layer to a bottom surface.

19. The method of claim 15, wherein altering the permanent defect region comprises removing a portion of the back surface of the semiconductor layer removing comprises grinding a portion of the back surface the semiconductor layer, wherein removing comprises chemically removing at least a portion of the bottom surface of the permanent pit.

20. The method of claim 15, wherein altering the permanent defect region comprises masking a portion of the upper surface of the semiconductor layer with a mask.

* * * * *